(12) United States Patent
 Guo

(10) Patent No.: US 10,867,564 B2
(45) Date of Patent: Dec. 15, 2020

(54) PANEL INSPECTION METHOD

(71) Applicant: Wuhan China Star Optoelectronics Technology Co., Ltd., Wuhan (CN)

(72) Inventor: Chunpeng Guo, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/488,586

(22) PCT Filed: May 14, 2019

(86) PCT No.: PCT/CN2019/086743
§ 371 (c)(1),
(2) Date: Aug. 25, 2019

(87) PCT Pub. No.: WO2020/133883
PCT Pub. Date: Jul. 2, 2020

(65) Prior Publication Data
US 2020/0365097 A1    Nov. 19, 2020

(30) Foreign Application Priority Data

Dec. 29, 2018 (CN) .......................... 2018 1 1639294

(51) Int. Cl.
*G09G 3/36* (2006.01)
*G01R 31/308* (2006.01)

(52) U.S. Cl.
CPC ............. *G09G 3/36* (2013.01); *G01R 31/308* (2013.01); *G09G 2320/0247* (2013.01)

(58) Field of Classification Search
CPC . G09G 3/36; G09G 2320/0247; G01R 31/308
See application file for complete search history.

(56) References Cited

U.S. PATENT DOCUMENTS

2009/0128527 A1* 5/2009 Itakura ................. G09G 3/3655
345/205

* cited by examiner

*Primary Examiner* — Charles V Hicks

(57) ABSTRACT

A panel inspection method is provided, including: S10: providing a host and at least two optical probes; S20: sending, by the host, a lighting command and inputting a common electrode voltage to the panel group; S30: inspecting, by each of the optical probes, respectively a flicker value of any panel in the panel group and returning the value to the host; S40: determining, by the host, whether the flicker value is an optimal flicker value.

10 Claims, 3 Drawing Sheets

PANEL INSPECTION METHOD

RELATED APPLICATIONS

This application is a National Phase of PCT Patent Application No. PCT/CN2019/086743 having International filing date of May 14, 2019, which claims the benefit of priority of Chinese Patent Application No. 201811639294.7 filed on Dec. 29, 2018. The contents of the above applications are all incorporated by reference as if fully set forth herein in their entirety.

FIELD AND BACKGROUND OF THE INVENTION

The present invention relates to the field of display technologies, and in particular, to a panel inspection method.

With the development of technology, liquid crystal displays are more and more widely used in people's lives. With the development of liquid crystal display technology, there are more and more types of liquid crystal displays. However, all kinds of liquid crystal displays are driven in the same way, that is, by applying an electric field to change the arrangement of liquid crystal molecules, so that the phase retardation of light in the liquid crystal layer is changed to change the transmittance, thereby displaying different grayscale brightness. However, due to the purity of the liquid crystal and the alignment film, etc., the liquid crystal must be driven by polarity reversal when driving the liquid crystal, that is, the liquid crystal is driven by the opposite voltage at different times, otherwise the liquid crystal will be polarized, thereby affecting the display effect and even damaging the display. Moreover, the average values of the positive and negative polarities are mutually offset, that is, the applied voltage cannot have a direct current component. Therefore, when driving a liquid crystal display, it is necessary to make the positive and negative polarity voltages symmetrical with respect to VCOM (common electrode voltage). Ideally, the voltages we apply at both ends of the liquid crystal are symmetrical with respect to VCOM. However, due to the coupling between the circuits, there is often a certain deviation between the positive and negative voltages, causing the screen to flicker.

When producing an LCD panel, a VCOM adjustment is made in the module factory to optimize the panel's Flicker. Among them, Flicker is a numerical variable, the larger the value indicates the more serious the panel flicker, and the general panel has a VCOM value that can correspond to the Flicker minimum point, that is, the panel flashing condition is the best.

The prior art uses a host with a single optical probe to inspect the Flicker value of the panel. Since the optical probe itself has a certain error and requires timing correction (generally once every 3 to 6 months), and the optical probe and the host need to be connected through a USB cable to transmit data, the Flicker value transmitted to the host is inaccurate due to the problem in the probe itself or poor connection of the cable in the normal module production process. It will appear that no matter how the host side adjusts the VCOM value, the returned Flicker value will not change. At this point, the host will randomly find a value as the best VCOM for this panel and burn it into this panel. Such leads to the fact that the panels that are shipped to the customers are not optimal VCOM, resulting in severe flicker, resulting in customer complaints or low factory yields.

In summary, the panel inspection method of the prior art uses a host with an optical probe to inspect the flicker value of the panel, which causes the flicker value transmitted to the host to be inaccurate, resulting in serious product flicker and affecting the production yield. Therefore, it is necessary to provide a new panel inspection method to improve this defect.

SUMMARY OF THE INVENTION

Technical Problem

The invention provides a panel inspection method, for solving the technical problem of the prior art that uses a host with an optical probe to inspect the flicker value of the panel, which causes the flicker value transmitted to the host to be inaccurate, resulting in serious product flicker and affecting the production yield.

Technical Solution

In order to solve the above problem, the technical solution provided by the present invention is as follows:

An embodiment of the present invention provides a panel inspection method, the method comprising:

S10: providing a host and an optical probe set, where the optical probe set includes at least two optical probes, and the optical probes are connected to the host through USB cables, for inspecting flicker values of the panels;

S20: sending, by the host, a lighting command and inputting a common electrode voltage to the panel group;

S30: inspecting, by each of the optical probes, respectively a flicker value of any panel in the panel group and returning the value to the host;

S40: determining, by the host, whether the flicker value is an optimal flicker value;

S50: if the host determines that the flicker value is an optimal flicker value, the host records a common electrode voltage corresponding to the optimal flicker value of the panel as an optimal common electrode voltage of the panel, and the optimal common electrode voltage is programmed in the panel;

S60: if the host determines that the flicker value is not an optimal flicker value, the host adjusts an input common electrode voltage value, and repeats steps S20 to S40 until the host determines that the flicker value is an optimal flicker value.

In the panel inspection method provided by the embodiment of the present invention, if any panel in the panel group has been programmed with the optimal common electrode voltage in step S20, the next panel is transmitted for complement inspection.

In the panel inspection method provided by the embodiment of the present invention, the number of optical probes is equal to the number of panels in the panel group in step S30.

In the panel inspection method provided by the embodiment of the present invention, the method of determining the optimal flicker value is to obtain a minimum flicker value by comparison in step S40, and the minimum flicker value is the optimal flicker value.

In the panel inspection method provided by the embodiment of the present invention, an adjustment range of the host adjusting input common electrode voltage values is selected back and forth with the optimal common electrode voltage as a center value in step S60.

An embodiment of the invention further provides a panel inspection method, the method comprising:

S101: collecting a range of optimal common electrode voltages of the same batch of panels, that is, a maximum optimal common electrode voltage value and a minimum optimal common electrode voltage value;

S102: extracting a central value in the range;

S103: confirming a difference of a flicker value that has the largest difference between the flicker values of any panel corresponding to the central value in the same batch of panels;

S104: sending, by a host, a lighting command and inputting the center value to any panel;

S105: using, by the host, an optical probe set to read back the flicker values and performing subtraction operations on each other;

S106: comparing the difference with the difference of the flicker value;

S107: if the difference is greater than the difference of the flicker value, an alarm notifies an engineer to correct the probe or check connection;

S108: if the difference is less than the difference of the flicker value, finding the optimal common electrode voltage and an optimal flicker value;

S109: after finding the optimal common electrode voltage, confirming whether the optimal common electrode voltage is within the range;

S110: if within the range, shipping out goods normally;

S111: If not within the range, the steps S107 to S109 are repeated until the optimum common electrode voltage is within the range.

In the panel inspection method provided by the embodiment of the present invention, the optical probe set includes at least two optical probes in S105, and the number of the flicker values is equal to the number of the optical probes.

In the panel inspection method provided by the embodiment of the present invention, the host performs subtraction operations in pairs for all the read flicker values in S105, to get the largest difference.

In the panel inspection method provided by the embodiment of the present invention, first find the optimal flicker value in S108, and after finding the optimal flicker value, the optimal common electrode voltage corresponding to the optimal flicker value is found.

In the panel inspection method provided by the embodiment of the present invention, the method of finding the optimal flicker value is to obtain a minimum flicker value by comparison in S108, which is the optimal flicker value.

Beneficial Effect

The beneficial effect of the present invention is as follows: A panel inspection method provided by the embodiment of the present invention switches a mode in which a host corresponds to one optical probe to a mode in which a host corresponds to two or more optical probes, thereby avoiding flickering abnormalities caused by abnormality of the probe itself or poor connection of the connecting wires, achieving the technical effect of improving module production yield.

BRIEF DESCRIPTION OF THE SEVERAL VIEWS OF THE DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled in the art based on these drawings without paying any creative effort.

DESCRIPTION OF SPECIFIC EMBODIMENTS OF THE INVENTION

The technical solutions in the embodiments of the present disclosure will be clearly and completely described in the following with reference to the accompanying drawings in the embodiments. It is apparent that the described embodiments are only a part of the embodiments of the present disclosure, and not all of them. All other embodiments obtained by those skilled in the art based on the embodiments of the present disclosure without paying any creative effort are the scope of the disclosure.

The panel inspection method of the prior art uses a host with an optical probe to inspect the flicker value of the panel, which causes the flicker value transmitted to the host to be inaccurate, resulting in serious product flicker and affecting the production yield. This embodiment can solve the defect.

Figure 1:
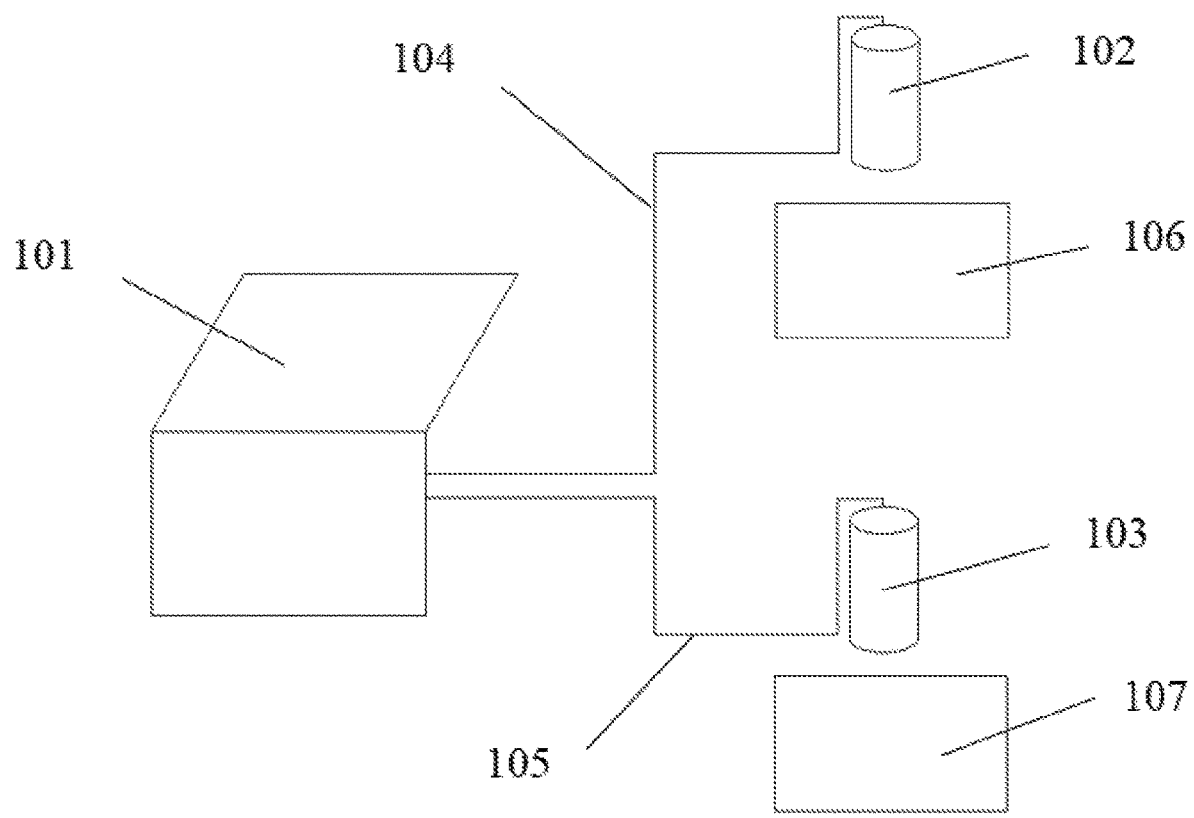
FIG. 1 is a structural diagram of a fixture for inspecting a panel flicker value according to an embodiment of the present invention.

FIG. 1 is a structural diagram of a fixture for inspecting a panel flicker value according to an embodiment of the present invention. The components of the present invention and the relative positional relationship between the components can be visually seen from the figure. The fixture for inspecting a panel flicker value includes a host 101 and an optical probe set, the optical probe set including at least two optical probes, a first optical probe 102 and a second optical probe 103. The first optical probe 102 is connected to the host 101 through a first connection wire 104, and the second optical probe 103 is connected to the host 101 through a second connection wire 105. The connecting wires may be USB cables, the first optical probe 102 correspondingly inspects the first panel 106, and the second optical probe 103 correspondingly inspects the second panel 107.

In this embodiment, the host 101 connects two or more optical probes to inspect the flicker values of the panels. By comparing the collected flicker values, it is avoided that when a host corresponds to one optical probe mode, the inspected flicker value is inaccurate due to abnormality of the probe itself or poor connection of the connecting wire. It can also improve the inspection efficiency.

Figure 2:
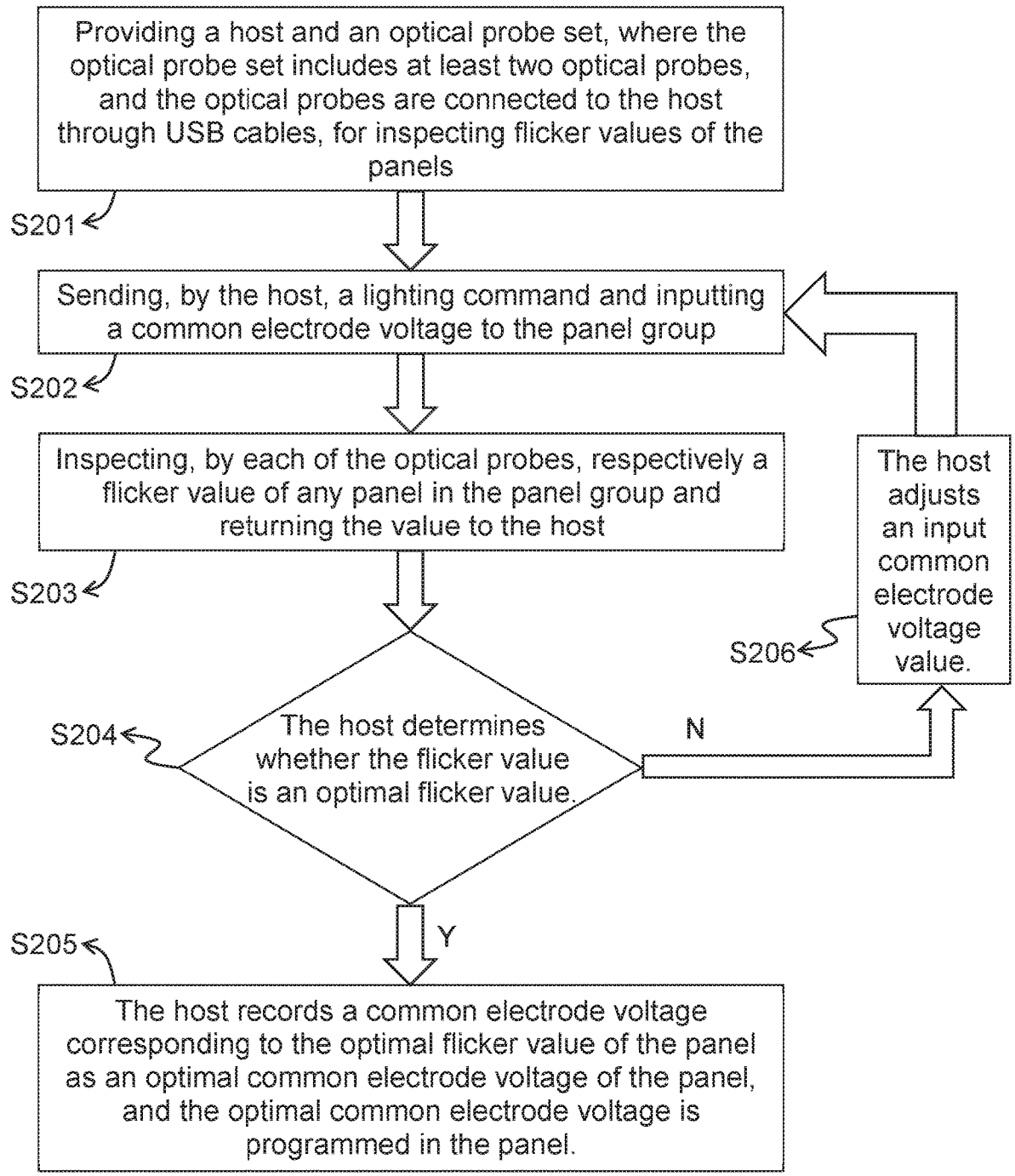
FIG. 2 is a flowchart of a panel inspection method according to a first embodiment of the present invention.

FIG. 2 is a flowchart of a panel inspection method according to a first embodiment of the present invention. The inspection method includes the following:

S201: providing a host and an optical probe set, where the optical probe set includes at least two optical probes, and the optical probes are connected to the host through USB cables, for inspecting flicker values of the panels;

S202: sending, by the host, a lighting command and inputting a common electrode voltage to the panel group;

S203: inspecting, by each of the optical probes, respectively a flicker value of any panel in the panel group and returning the value to the host;

S204: determining, by the host, whether the flicker value is an optimal flicker value;

S205: if the host determines that the flicker value is an optimal flicker value, the host records a common electrode voltage corresponding to the optimal flicker value of the panel as an optimal common electrode voltage of the panel, and the optimal common electrode voltage is programmed in the panel;

S206: if the host determines that the flicker value is not an optimal flicker value, the host adjusts an input common electrode voltage value, and repeats steps S202 to S205 until the host determines that the flicker value is an optimal flicker value.

In this embodiment, if any panel in the panel group has been programmed with the optimal common electrode voltage in step S202, the next panel is transmitted for complement inspection; the number of optical probes is equal to the number of panels in the panel group in step S203; the method of determining the optimal flicker value is to obtain a minimum flicker value by comparison in step S204, and the minimum flicker value is the optimal flicker value; in step S206, an adjustment range of the host adjusting input common electrode voltage values is selected back and forth with the optimal common electrode voltage as a center value.

Figure 3:
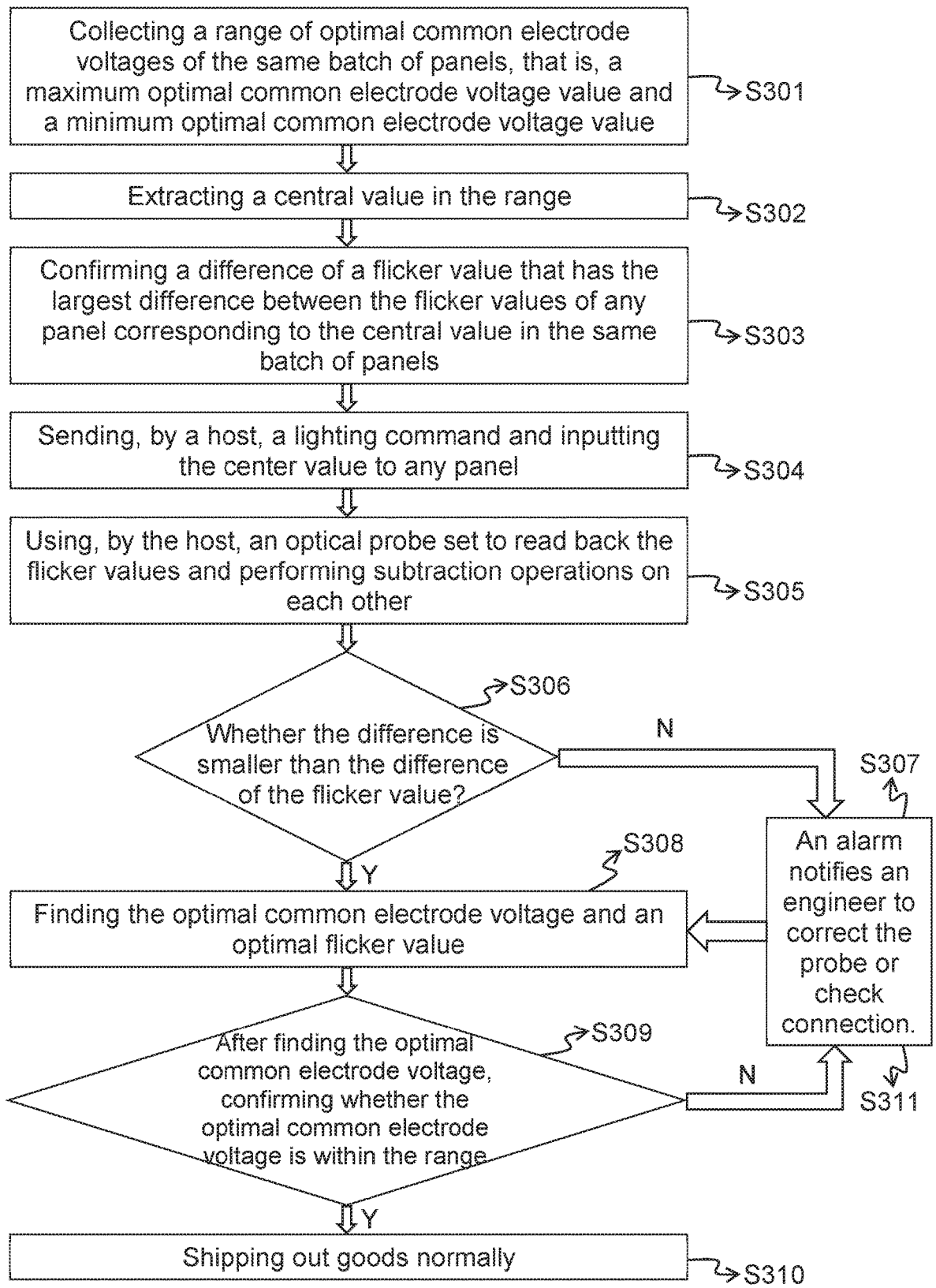
FIG. 3 is a flowchart of a panel inspection method according to a second embodiment of the present invention.

FIG. 3 is a flowchart of a panel inspection method according to a second embodiment of the present invention. The inspection method includes the following:

S301: collecting a range of optimal common electrode voltages of the same batch of panels, that is, a maximum optimal common electrode voltage value and a minimum optimal common electrode voltage value;

S302: extracting a central value in the range;

S303: confirming a difference of a flicker value that has the largest difference between the flicker values of any panel corresponding to the central value in the same batch of panels;

S304: sending, by a host, a lighting command and inputting the center value to any panel;

S305: using, by the host, an optical probe set to read back the flicker values and performing subtraction operations on each other;

S306: comparing the difference with the difference of the flicker value, and determining whether the difference is smaller than the difference of the flicker value;

S307: if the difference is greater than the difference of the flicker value, an alarm notifies an engineer to correct the probe or check connection;

S308: if the difference is less than the difference of the flicker value, finding the optimal common electrode voltage and an optimal flicker value;

S309: after finding the optimal common electrode voltage, confirming whether the optimal common electrode voltage is within the range;

S310: if within the range, shipping out goods normally;

S311: If not within the range, the steps S307 to S309 are repeated until the optimum common electrode voltage is within the range.

In S305, the optical probe set includes at least two optical probes, and the number of the flicker values is equal to the number of the optical probes. The host performs subtraction operations in pairs for all the read flicker values, to get the largest difference. In S308, first find the optimal flicker value, and after finding the optimal flicker value, the optimal common electrode voltage corresponding to the optimal flicker value is found. The method of finding the optimal flicker value is to obtain a minimum flicker value by comparison, which is the optimal flicker value.

In this embodiment, the two-step judging program is disposed to further inspect the accuracy of the collected data. If the two-step judging program cannot be passed, the alarm notifies the engineer to correct the probe or check the connection, and the standard optimal flicker value is obtained after the process problem is solved. Then, the optimal common electrode voltage corresponding to the optimal flicker value is programmed into the panel to optimize the product quality and greatly improve the production yield of the module.

In summary, a panel inspection method provided by the embodiment of the present invention switches a mode in which a host corresponds to one optical probe to a mode in which a host corresponds to two or more optical probes, thereby avoiding flickering abnormalities caused by abnormality of the probe itself or poor connection of the connecting wires, achieving the technical effect of improving module production yield. The technical problem of prior art, which uses a host with an optical probe to inspect the flicker value of the panel, resulting in inaccurate flicker value transmitted to the host, resulting in serious product flicker and affecting production yield, is finally solved.

A panel inspection method provided by an embodiment of the present invention is described in detail above. It is understood that the exemplary embodiments described herein are to be considered as illustration only, for helping to understand the method of present invention and its core ideas, and are not intended to limit the invention.

What is claimed is:

1. A panel inspection method, comprising:
    S10: providing a host and an optical probe set, where the optical probe set includes at least two optical probes, and the optical probes are connected to the host through USB cables, for inspecting flicker values of panels in a panel group;
    S20: sending a lighting command and inputting a common electrode voltage to the panels in the panel group by the host;
    S30: inspecting a flicker value of any one of the panels in the panel group and returning the flicker value to the host by each of the optical probes, respectively;
    S40: determining, by the host, whether the flicker value is an optimal flicker value;
    S50: if the host determines that the flicker value is the optimal flicker value, the host records a common electrode voltage corresponding to the optimal flicker value of the one of the panels as an optimal common electrode voltage of the one of the panels, and the optimal common electrode voltage is programmed in the one of the panels; and
    S60: if the host determines that the flicker value is not the optimal flicker value, the host adjusts an input common electrode voltage value, and repeats steps S20 to S40 until the host determines that the flicker value is the optimal flicker value.

2. The panel inspection method as claimed in claim 1, wherein if the any one of the panels in the panel group has been programmed with the optimal common electrode voltage in step S50, a next one of the panels is transmitted for complement inspection.

3. The panel inspection method as claimed in claim 1, wherein a number of the optical probes is equal to a number of the panels in the panel group in step S30.

4. The panel inspection method as claimed in claim 1, wherein a method of determining the optimal flicker value is to obtain a minimum flicker value by comparison in step S40, and the minimum flicker value is the optimal flicker value.

5. The panel inspection method as claimed in claim 1, wherein an adjustment range of the input common electrode voltage value adjusted by the host is selected from back and forth with the optimal common electrode voltage as a center value in step S60.

6. A panel inspection method, comprising:
S101: collecting a range of an optimal common electrode voltage of panels in a same batch, that is, a maximum optimal common electrode voltage value and a minimum optimal common electrode voltage value;
S102: extracting a central value in the range;
S103: confirming a flicker value difference with a largest difference between flicker values of any one of the panels corresponding to the central value in the same batch;
S104: sending a lighting command and inputting the center value to the any one of the panels by a host;
S105: reading back the flicker values through an optical probe set by the host, and performing subtraction operations with respect to each other between the flicker values;
S106: comparing a value difference with the flicker value difference;
S107: if the value difference is greater than the flicker value difference, alarming to notify an engineer to calibrate the optical probe set or check connections;
S108: if the value difference is less than the flicker value difference, finding the optimal common electrode voltage and an optimal flicker value;
S109: after finding the optimal common electrode voltage, confirming whether the optimal common electrode voltage is within the range;
S110: if within the range, shipping out goods normally; and
S111: if not within the range, repeating the steps S107 to S109 until the optimum common electrode voltage is within the range.

7. The panel inspection method as claimed in claim 6, wherein the optical probe set includes at least two optical probes in S105, and a number of the flicker values is equal to a number of the optical probes.

8. The panel inspection method as claimed in claim 6, wherein all the read flicker values are subtracted one by one to obtain a maximum value difference in S105.

9. The panel inspection method as claimed in claim 6, wherein the optimal flicker value is first found in S108, and after the optimal flicker value is found, the optimal common electrode voltage is a one corresponding to the optimal flicker value.

10. The panel inspection method as claimed in claim 6, wherein a method of finding the optimal flicker value in S108 is to obtain a minimum flicker value by comparison, and the minimum flicker value is the optimal flicker value.

* * * * *